(12) United States Patent
Guler et al.

(10) Patent No.: US 11,972,979 B2
(45) Date of Patent: *Apr. 30, 2024

(54) 1D VERTICAL EDGE BLOCKING (VEB) VIA AND PLUG

(71) Applicant: Intel Corporation, Santa Clara, CA (US)

(72) Inventors: Leonard P. Guler, Hillsboro, OR (US); Michael Harper, Hillsboro, OR (US); Suzanne S. Rich, Hillsboro, OR (US); Charles H. Wallace, Portland, OR (US); Curtis Ward, Forest Grove, OR (US); Richard E. Schenker, Portland, OR (US); Paul Nyhus, Portland, OR (US); Mohit K. Haran, Hillsboro, OR (US); Reken Patel, Portland, OR (US); Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/207,047

(22) Filed: Jun. 7, 2023

(65) Prior Publication Data

US 2023/0326794 A1 Oct. 12, 2023

Related U.S. Application Data

(62) Division of application No. 16/435,902, filed on Jun. 10, 2019, now Pat. No. 11,721,580.

(51) Int. Cl.
*H01L 21/768* (2006.01)
*H01L 21/033* (2006.01)
*H01L 21/8234* (2006.01)

(52) U.S. Cl.
CPC .... *H01L 21/76897* (2013.01); *H01L 21/0337* (2013.01); *H01L 21/823412* (2013.01); *H01L 21/823475* (2013.01)

(58) Field of Classification Search
CPC ........... H01L 21/0337; H01L 21/76897; H01L 21/823412; H01L 21/823457

(Continued)

(56) References Cited

U.S. PATENT DOCUMENTS

2020/0006083 A1* 1/2020 Huang ............... H01L 21/76832
2020/0126865 A1* 4/2020 Huang ............. H01L 21/823475
2020/0381306 A1* 12/2020 Park .................. H01L 29/66795

FOREIGN PATENT DOCUMENTS

TW 201405642 2/2014
TW 202002113 1/2020

OTHER PUBLICATIONS

Office Action from Taiwan Patent Application No. 109115038, mailed Feb. 2, 2024, 12 pgs.

* cited by examiner

*Primary Examiner* — Matthew E. Gordon
(74) *Attorney, Agent, or Firm* — Schwabe, Williamson & Wyatt, P.C.

(57) ABSTRACT

Embodiments disclosed herein include semiconductor devices and methods of forming such devices. In an embodiment a semiconductor device comprises a first interlayer dielectric (ILD), a plurality of source/drain (S/D) contacts in the first ILD, a plurality of gate contacts in the first ILD, wherein the gate contacts and the S/D contacts are arranged in an alternating pattern, and wherein top surfaces of the gate contacts are below top surfaces of the S/D contacts so that a channel defined by sidewall surfaces of the first ILD is positioned over each of the gate contacts, mask layer partially filling a first channel over a first gate contact, and a fill (Continued)

metal filling a second channel over a second gate contact that is adjacent to the first gate contact.

22 Claims, 13 Drawing Sheets

(58) Field of Classification Search
USPC .......................................................... 257/774
See application file for complete search history.

1D VERTICAL EDGE BLOCKING (VEB) VIA AND PLUG

CROSS-REFERENCE TO RELATED APPLICATIONS

This application is a division of U.S. patent application Ser. No. 16/435,902, filed on Jun. 10, 2019, the entire contents of which is hereby incorporated by reference herein.

TECHNICAL FIELD

Embodiments of the disclosure are in the field of semiconductor structures and processing and, in particular, to methods for improving edge placement error margins by using vertical edge blocking (VEB) features.

BACKGROUND

In back end of line (BEOL) fabrication, conductive vias and insulative plugs are needed in order to provide the desired electrical routing between layers of the BEOL stack. During the fabrication of the vias and plugs, edge placement errors may generate defects in the device. For example, edge placement errors may result in the creation of unwanted vias that result in undesirable shorts in the BEOL stack. In some BEOL stacks, gratings are used to provide increased overlay margins to avoid edge placement errors. However, as critical dimensions continue to scale, the widths of the gratings decrease. Accordingly, the margins for edge placement error continue to decrease.

DESCRIPTION OF THE EMBODIMENTS

Figure 1A:
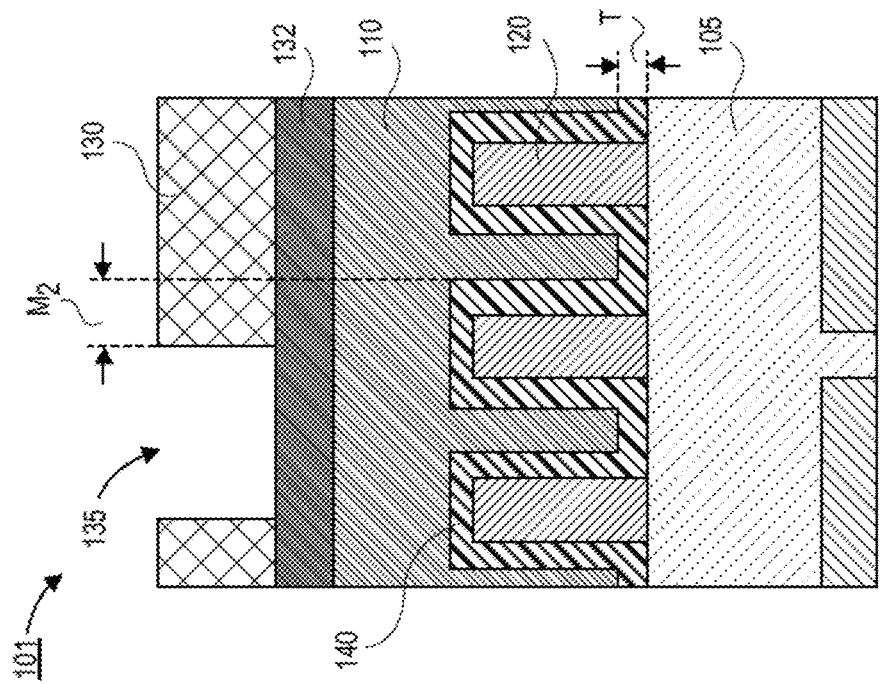
FIG. 1A is a cross-sectional illustration of a semiconductor device that illustrates the small edge placement error margins.

Embodiments described herein comprise semiconductor devices and methods of forming such devices using vertical edge blocking (VEB) features. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, edge placement error margins are continuing to decrease as semiconductor devices continue to scale to smaller critical dimensions. An example of the available edge placement error margin is shown in FIG. 1A. A semiconductor device 100 is shown in FIG. 1A. The semiconductor device 100 includes a substrate 105 and a grating 120 including a plurality of parallel lines. A hardmask 110 is disposed over the grating 120, and a resist layer 130 and an antireflective coating 132 are disposed over the hardmask 110. As shown, the grating 120 has a pitch P and each of the lines have a width W. For example, the pitch P may be approximately 30 nm and the width W may be approximately 12 nm.

As shown, an opening 135 over a channel between lines of the grating 120 is patterned into the resist layer 130. The opening 135 may have an edge placement error margin $M_1$. In cases where the pitch P is approximately 30 nm and the width W is approximately 12 nm, the edge placement error margin $M_1$ is only approximately 6 nm. That is, all overlay errors in the system can only add up to approximately 6 nm. If the overlay errors exceed 6 nm, there is a chance that the opening 135 will inadvertently extend over a neighboring channel. This will result in defects in the semiconductor device (e.g., undesirable vias or plugs).

Accordingly, embodiments disclosed herein include a vertical edge blocking (VEB) mask layer that increases the edge placement error margin. The increase in the margin allows for greater protection against printing defects and allows for improved scaling of the semiconductor device to smaller critical dimensions (CDs). An example of a semiconductor device 101 that utilizes a VEB mask layer 140 is shown in FIG. 1B.

Figure 1B:
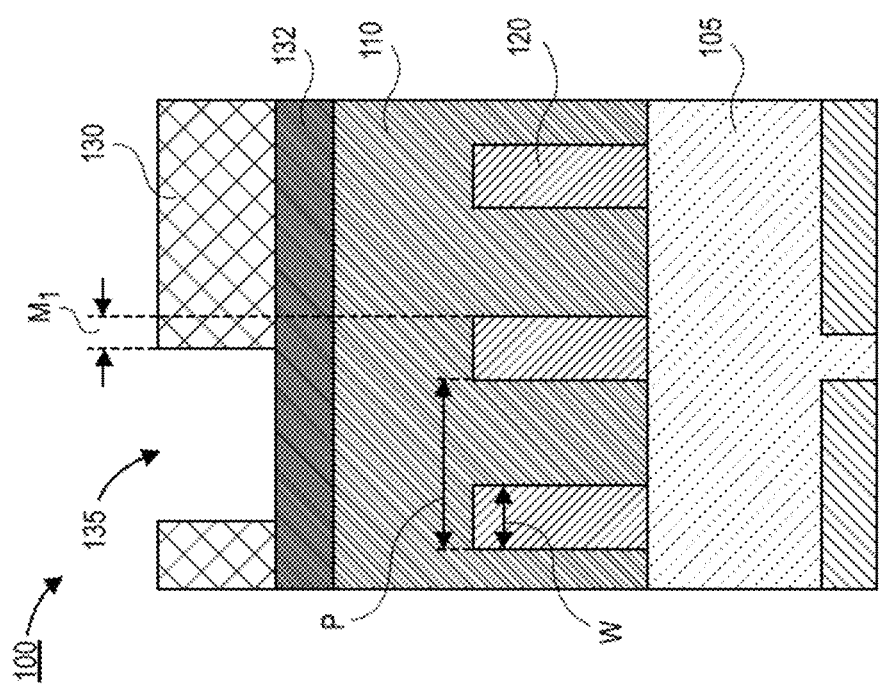
FIG. 1B is a cross-sectional illustration of a semiconductor device that includes a vertical edge blocking (VEB) mask layer that increases the edge placement error margins, in accordance with an embodiment.

Referring now to FIG. 1B, a cross-sectional illustration of a semiconductor device 101 is shown, in accordance with an embodiment. The semiconductor device 101 may be substantially similar to the semiconductor device 100 illustrated in FIG. 1A, with the exception that the grating 120 is lined with a VEB mask layer 140. The VEB mask layer 140 is a conformal layer that is disposed along sidewall surfaces and top surfaces of the grating 120. The inclusion of the VEB mask layer 140, therefore, increases the width of the lines in the grating 120. As such, the edge placement error margin $M_2$ is increased. For example, the edge placement error margin $M_2$ may be increased by an amount substantially equal to a thickness T of the VEB mask layer 140. For example, the VEB mask layer 140 may have a thickness of approximately 5 nm. In such embodiments, the edge placement error margin $M_2$ may be increased from 6 nm to 11 nm.

Referring now to FIGS. 2A-2E, a series of cross-sectional illustrations that depict a process for forming vias in a semiconductor device 200 with the use of a VEB mask layer 240 is shown, in accordance with an embodiment.

Figure 2A:
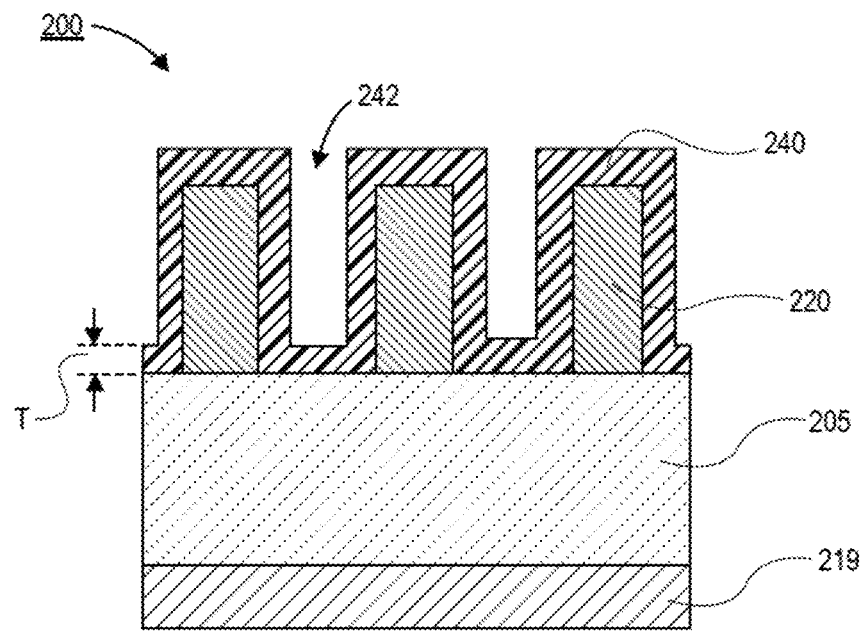
FIG. 2A is a cross-sectional illustration of a semiconductor device that includes a grating and a VEB mask layer over the grating, in accordance with an embodiment.

Referring now to FIG. 2A, a cross-sectional illustration of a semiconductor device 200 is shown, in accordance with an embodiment. In the illustrated embodiment, only a portion of the back end of line (BEOL) stack is shown. It is to be appreciated that the BEOL stack may be disposed over a semiconductor substrate. In an embodiment, the underlying semiconductor substrate may be a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates.

In the illustrated embodiment, an interconnect layer of the BEOL stack is shown. For example, a metal layer 219 and an interlayer dielectric (ILD) 205 over the metal layer 219 are illustrated. The metal layer 219 may comprise conductive traces used to provide interconnects to devices on the underlying semiconductor substrate. In an embodiment, as is also used throughout the present description, metal layers or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, a grating 220 is positioned over the ILD 205. The grating 220 may comprise a plurality of parallel lines that are spaced at a regular pitch. The grating 220 may be any suitable material that is etch selective to the underlying ILD 205. For example, the grating 220 may comprise a hardmask material. In some embodiments, the grating 220 may comprise a single material layer, or the grating 220 may comprise a stack of more than one material layers.

In an embodiment, a VEB mask layer 240 is disposed over the grating 220. The VEB mask layer 240 may be a conformal layer. That is, the VEB mask layer 240 may line the sidewalls and top surface of the grating 220. The VEB mask layer 240 may also be disposed over exposed top surfaces of the ILD 205 located between the grating 220. Any suitable conformal deposition process may be used to deposit the VEB mask layer 240. For example, the VEB mask layer 240 may be deposited by atomic layer deposition (ALD), CVD, or the like. In an embodiment, the VEB mask layer 240 may have a thickness T. In an embodiment, the thickness T may be approximately 10 nm or less, or approximately 5 nm or less. The VEB mask layer 240 may comprise a material that is etch selective to surrounding materials. For example, the VEB mask layer 240 may comprise silicon and nitrogen (e.g., SiN), silicon and oxygen (e.g., $SiO_2$), aluminum and oxygen (e.g., $Al_2O$), or titanium and nitrogen (e.g., TiN). In an embodiment, the VEB mask layer 240 reduces the width of the channel between neighboring lines of the grating 220. For example, channels 242 may be defined by the vertical portions of the VEB mask layer 240.

Figure 2B:
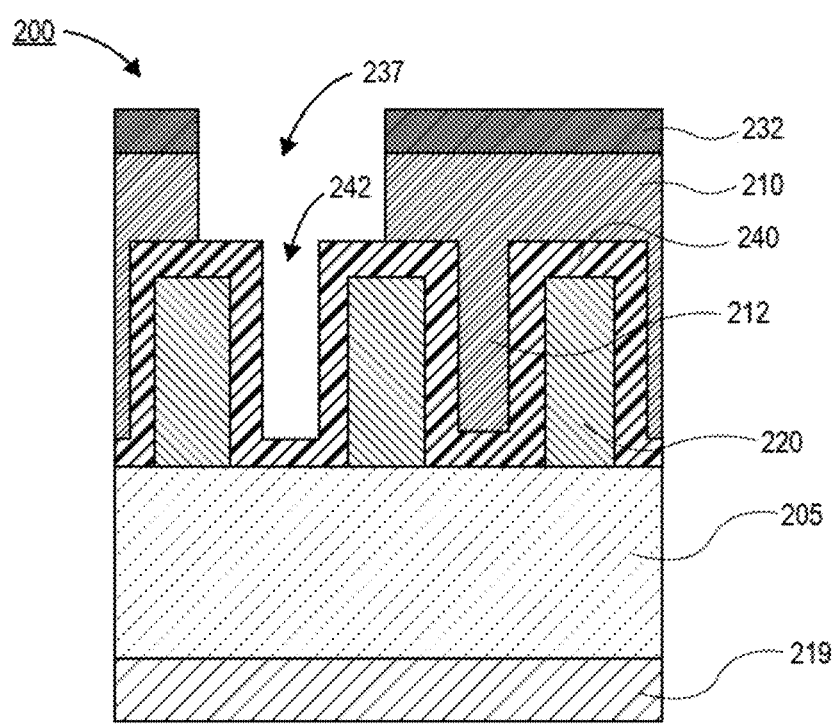
FIG. 2B is a cross-sectional illustration of the semiconductor device after a hardmask is disposed over the grating and patterned, in accordance with an embodiment.

Referring now to FIG. 2B, a cross-sectional illustration after a hardmask 210 is disposed over the semiconductor device 200 and patterned is shown, in accordance with an embodiment. In an embodiment, the hardmask 210 may fill the channels 242 between the grating 220. The portion of the hardmask 210 that fills the channels 242 may be referred to herein as hardmask 212. The hardmask 210 may be patterned with any suitable lithographic process. For example, an antireflective coating (ARC) 232 used in the patterning process is shown above the hardmask 210. It is to be appreciated that other layers (e.g., resist layers, etc.) may also be used in the patterning process.

In an embodiment, the hardmask 210 is patterned to form an opening 237 above one of the channels 242. The patterning process clears the hardmask 210 including the portions of the hardmask 212 in the exposed channel 242. That is, the channel 242 is substantially cleared during the patterning process, and sidewall surfaces of the VEB mask layer 240 are exposed.

Figure 2C:
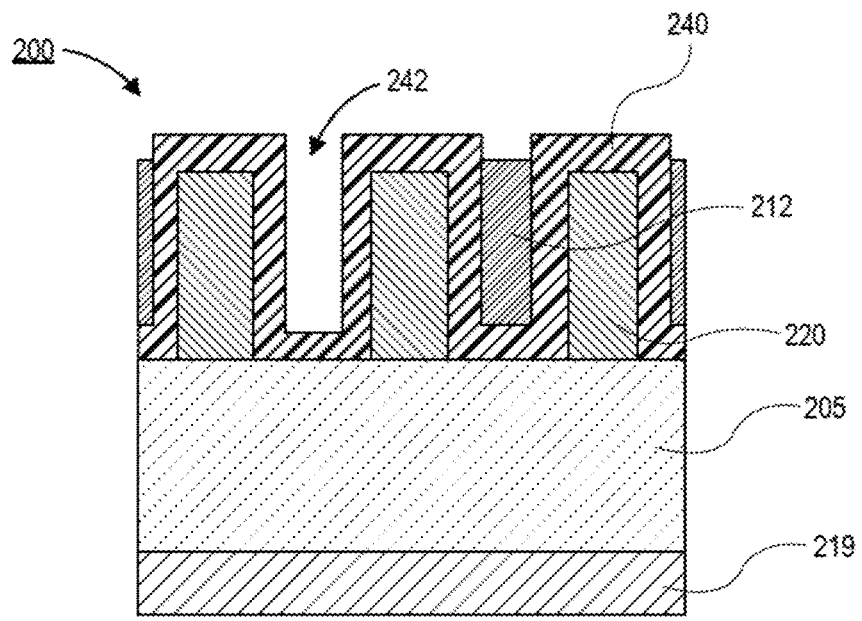
FIG. 2C is a cross-sectional illustration of the semiconductor device after the hardmask is recessed, in accordance with an embodiment.

Referring now to FIG. 2C, a cross-sectional illustration of the semiconductor device 200 after the hardmask 210 is recessed is shown, in accordance with an embodiment. In an embodiment, the hardmask 210 may be recessed so that only portions of the hardmask 212 in the channels 242 remain. As shown, the top surfaces of the portions of the hardmask 212 are recessed below a top surface of the VEB mask layer 240. In an embodiment, the hardmask 210/212 may be recessed with an etching process.

Figure 2D:
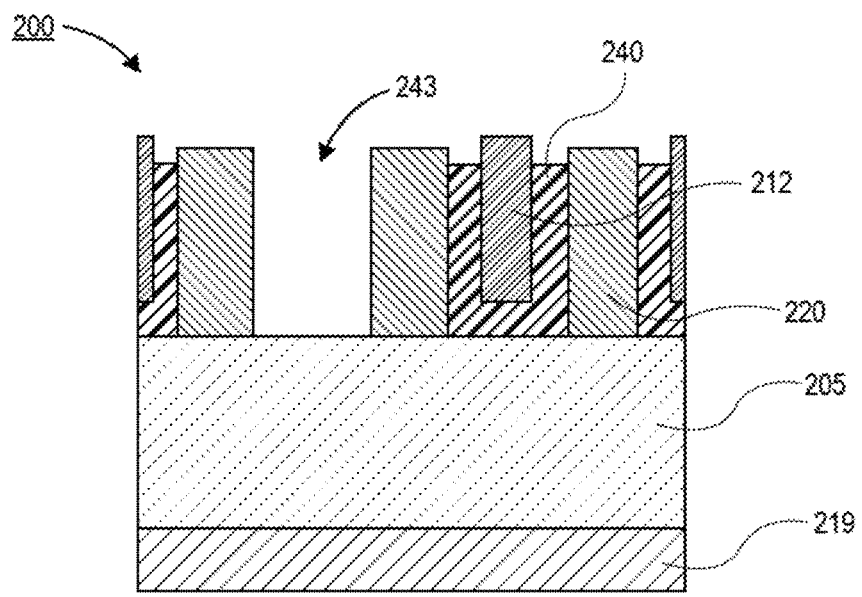
FIG. 2D is a cross-sectional illustration of the semiconductor device after a portion of the VEB mask layer is removed to clear an opening between the grating, in accordance with an embodiment.

Referring now to FIG. 2D, a cross-sectional illustration of the semiconductor device 200 after the VEB mask layer 240 is selectively etched is shown, in accordance with an embodiment. In an embodiment, the VEB mask layer 240 may be etched with an isotropic etching process. The use of an isotropic etching process allows for the portion of the VEB mask layer 240 in the exposed channel 242 to be cleared while preserving the portions of the VEB mask layer 240 that are protected by the hardmask 212. The selective removal of the VEB mask layer 240 provides channels 243 that are cleared and provide locations where full width vias may be patterned.

In a particular embodiment, the isotropic etching process is a timed etching process. For example, the etching process may be timed so that after the channel 242 is entirely cleared, the etching process is stopped. Since the sidewall surfaces of the VEB mask layer 240 are protected by the hardmask 212, the use of a timed etch limits the removal from the top surface. However, due to the isotropic nature of the etching process, the top surfaces of the remaining portions of the VEB mask layer 240 may be recessed below a top surface of the hardmask 212 in some embodiments.

Figure 2E:
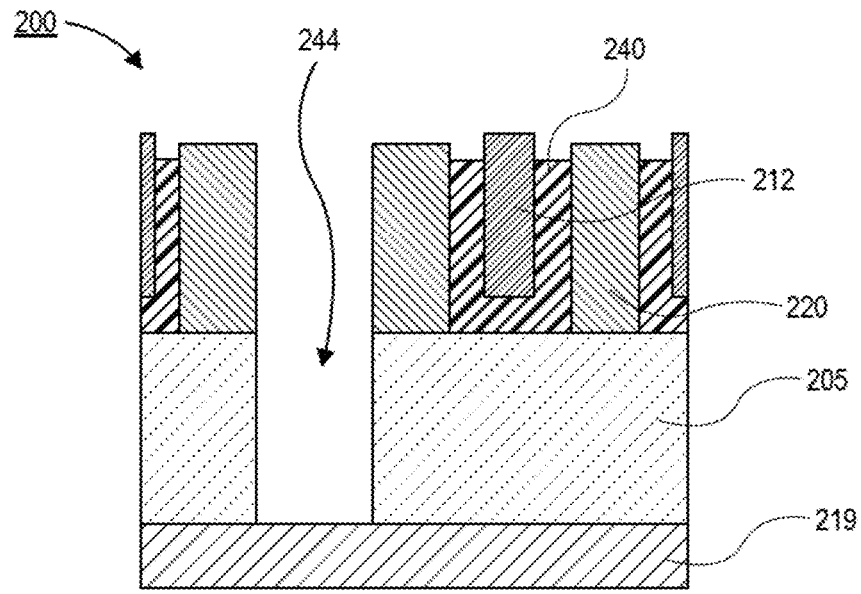
FIG. 2E is a cross-sectional illustration of the semiconductor device after the opening is transferred into the substrate, in accordance with an embodiment.

Referring now to FIG. 2E, a cross-sectional illustration of the semiconductor device 200 after a via opening 244 below channel 243 is transferred into the underlying ILD 205 is shown, in accordance with an embodiment. As shown, the residual portions of the VEB mask layer 240, the hardmask 212, and the grating 220 provide protection to the underlying ILD 205 where a via opening is not desired.

Figure 2F:
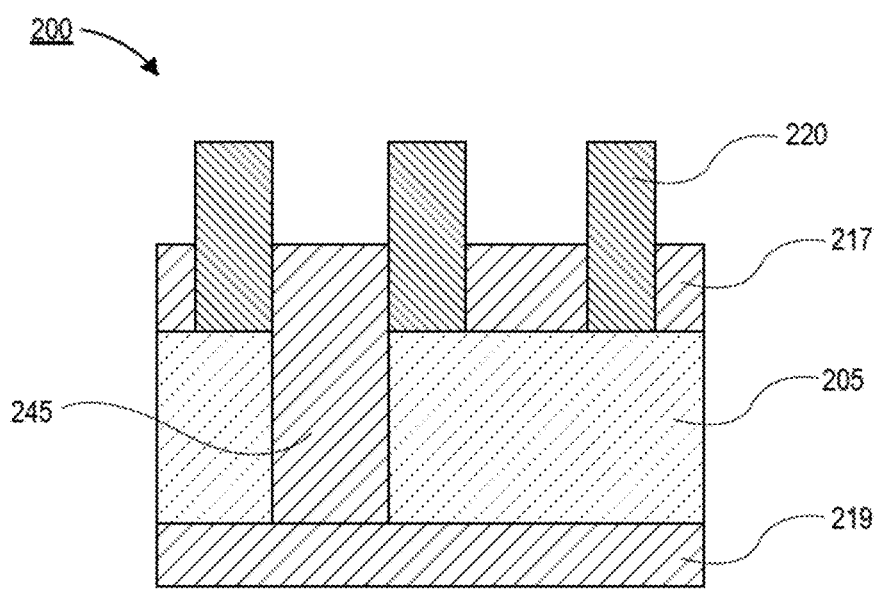
FIG. 2F is a cross-sectional illustration of the semiconductor device after the VEB mask layer is removed and the opening is plated to form a via, in accordance with an embodiment.

Referring now to FIG. 2F, a cross-sectional illustration of the semiconductor device 200 after via 245 and a second metal layer 217 are formed is shown, in accordance with an embodiment. In an embodiment, the via 245 and the second metal layer 217 may be deposited after the residual portions of the VEB mask layer 240 and the hardmask 212 are removed. The via 245 and the second metal layer 217 may be deposited with any suitable process, such as electroplating, or the like. In an embodiment, the via 245 provides electrical coupling between the first metal layer 219 and the second metal layer 217.

Figure 3A:
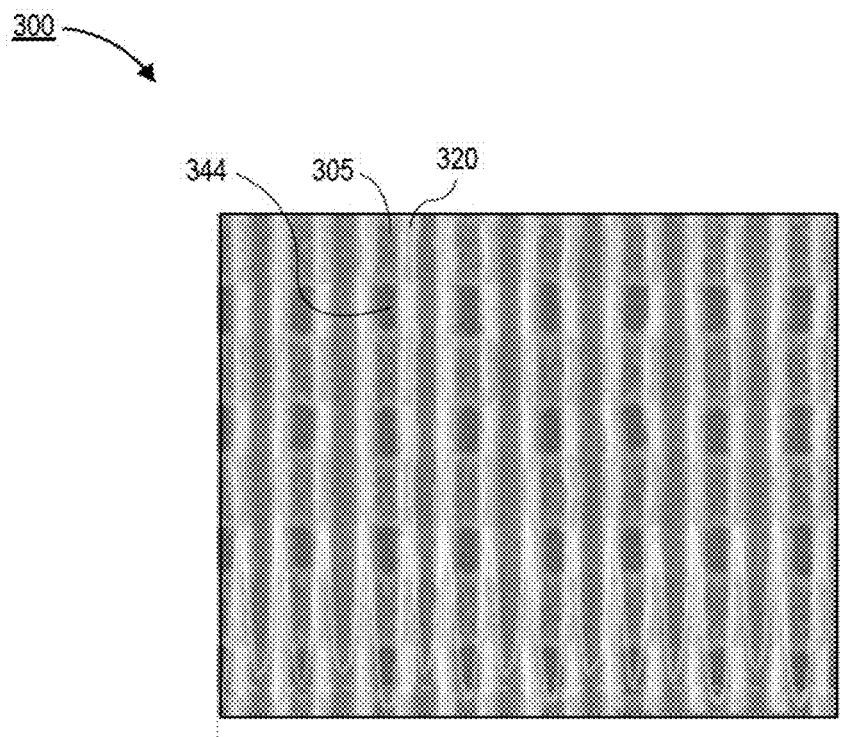
FIG. 3A is a plan view micrograph of a semiconductor device that illustrates the openings formed in the grating, in accordance with an embodiment.
Figure 3B:
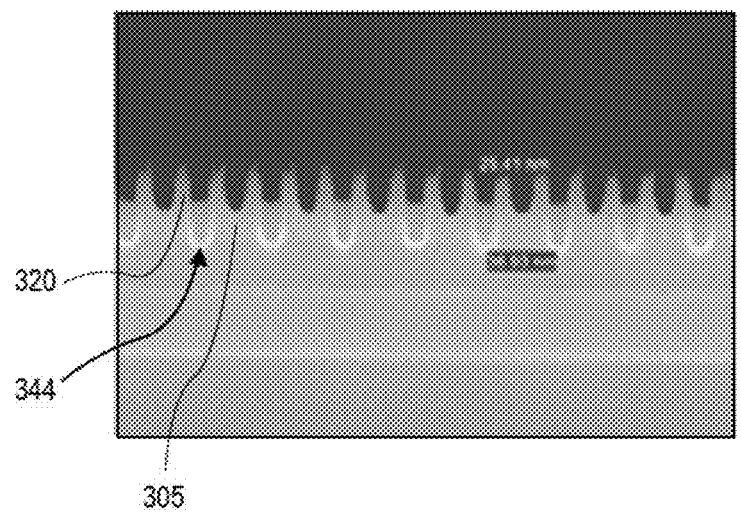
FIG. 3B is a cross-sectional micrograph of a semiconductor device that illustrates the openings formed in the grating, in accordance with an embodiment.

Referring now to FIGS. 3A and 3B, a plan view micrograph and a cross-sectional micrograph depict the semiconductor device 300 after the via openings 344 are formed are shown, in accordance with an embodiment. In FIG. 3A, the grating 320 comprising a plurality of substantially parallel lines are visible. The underlying ILD 305 and the via openings 344 are visible between the parallel lines of the grating 320. In FIG. 3B, it is shown that the parallel lines of the grating 320 may have cross-sections that are not necessarily rectangular, as shown in the Figures above. For example, the parallel lines of the grating 320 may have rounded top surfaces. Similarly, the via openings 344 may have rounded surfaces.

Referring now to FIGS. 4A-4G, a series of cross-sectional illustrations that depict a process for forming plugs in an interconnect layer of a semiconductor device 400 is shown, in accordance with an embodiment.

Figure 4A:
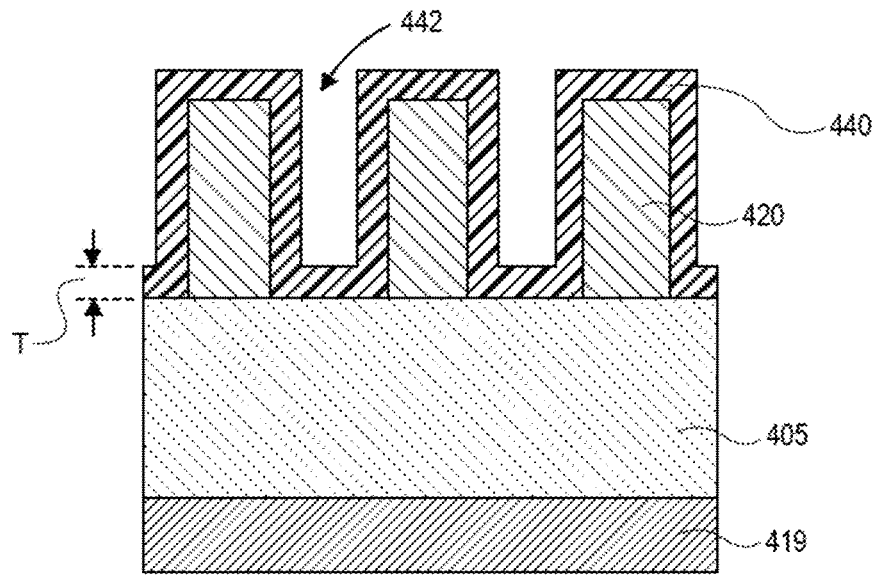
FIG. 4A is a cross-sectional illustration of a semiconductor device with a grating and a VEB mask layer over the grating, in accordance with an embodiment.

Referring now to FIG. 4A, a cross-sectional illustration of a semiconductor device 400 with a grating 420 is shown, in accordance with an embodiment. In an embodiment, the semiconductor device 400 may comprise a metal layer 419 and an ILD 405 over the metal layer 419. The grating 420 may comprise a plurality of parallel lines that are spaced at a regular pitch.

In an embodiment, a VEB mask layer 440 is disposed over the grating 420. The VEB mask layer 440 may be a conformal layer. That is, the VEB mask layer 440 may line the sidewalls and top surface of the grating 420. The VEB mask layer 440 may also be disposed over exposed top surfaces of the ILD 405 located between the grating 420. Any suitable conformal deposition process may be used to deposit the VEB mask layer 440. For example, the VEB mask layer 440 may be deposited by ALD, CVD, or the like. In an embodiment, the VEB mask layer 440 may have a thickness T. In an embodiment, the thickness T may be approximately 10 nm or less, or approximately 5 nm or less. The VEB mask layer 440 may comprise a material that is etch selective to surrounding materials. For example, the VEB mask layer 440 may comprise silicon and nitrogen (e.g., SiN), silicon and oxygen (e.g., $SiO_2$), aluminum and oxygen (e.g., $Al_2O$), or titanium and nitrogen (e.g., TiN). In an embodiment, the VEB mask layer 440 reduces the width of the channel between neighboring lines of the grating 420. For example, channels 442 may be defined by the vertical portions of the VEB mask layer 440.

Figure 4B:
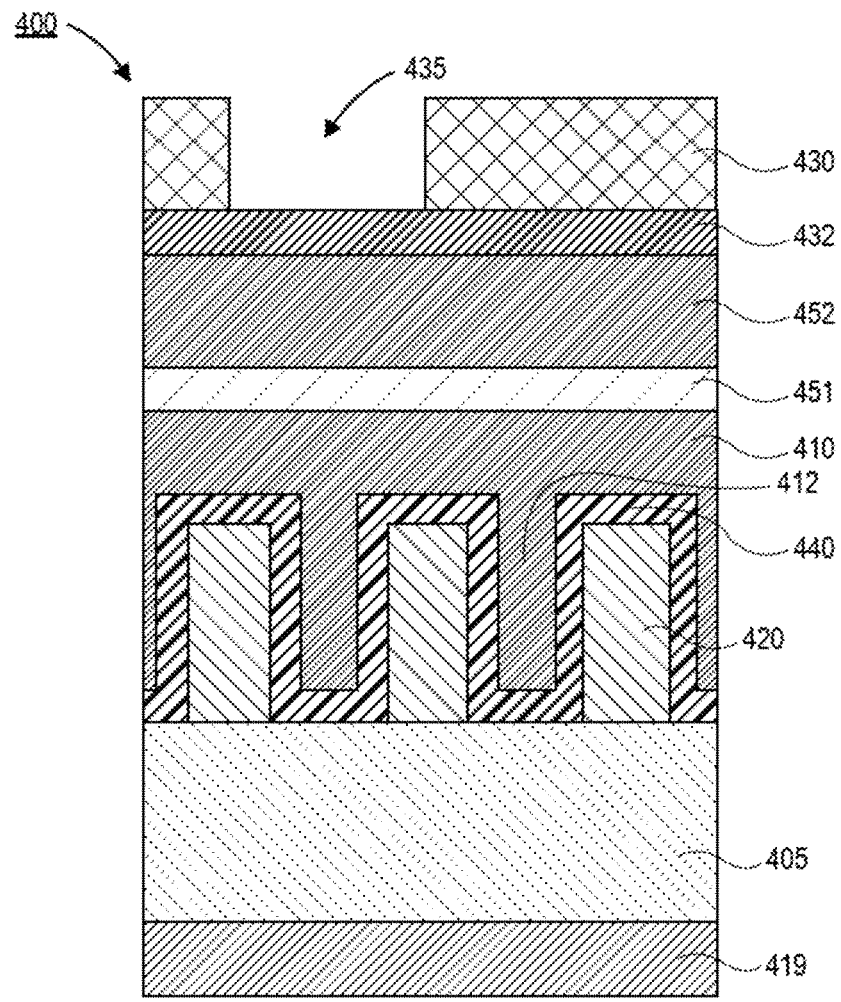
FIG. 4B is a cross-sectional illustration of the semiconductor device after a hardmask is disposed over the VEB mask layer, in accordance with an embodiment.

Referring now to FIG. 4B, a cross-sectional illustration after a hardmask 410 is disposed over the grating is shown, in accordance with an embodiment. In an embodiment, the hardmask 410 may fill the channels 442 of the grating. For example, portions of the hardmask 412 may fill the channels 442. In an embodiment, a plurality of patterning layers may be disposed over the hardmask 410. For example, the patterning layers may comprise a silicon oxide layer 451, a second hardmask layer 452, an ARC 432, and a resist layer 430. In an embodiment, the resist layer 430 may be patterned to form an opening 435.

Figure 4C:
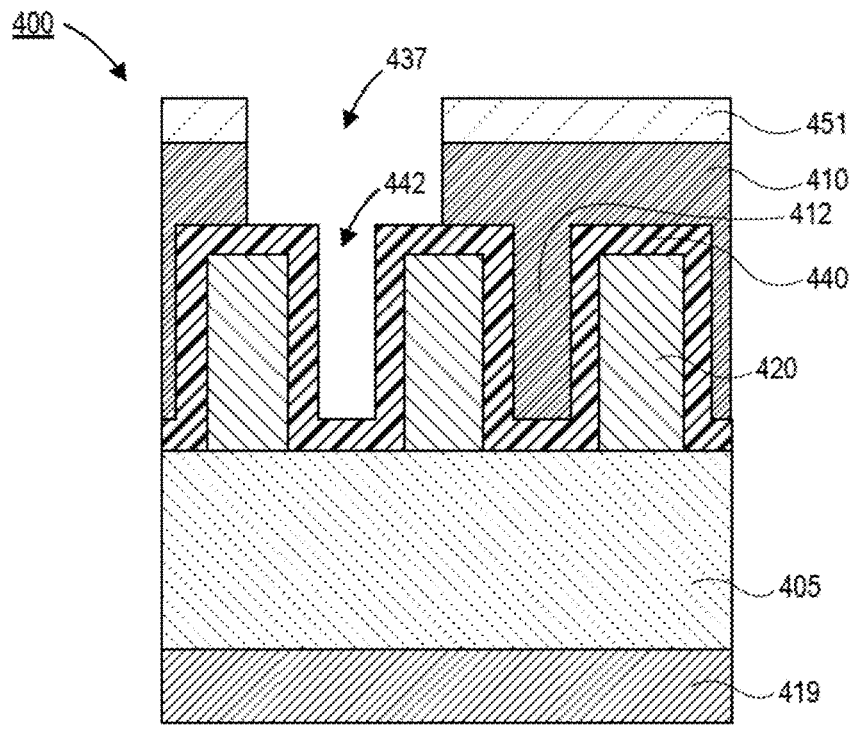
FIG. 4C is a cross-sectional illustration of the semiconductor device after the hardmask is patterned to form an opening, in accordance with an embodiment.

Referring now to FIG. 4C, a cross-sectional illustration after the hardmask 410 is patterned is shown, in accordance with an embodiment. In an embodiment, the hardmask 410 is patterned to form an opening 437 above one of the channels 442. The patterning process clears the hardmask 410 including the portions of the hardmask 412 in the exposed channel 442. That is, the channel 442 is substantially cleared during the patterning process, and sidewall surfaces of the VEB mask layer 440 are exposed.

Figure 4D:
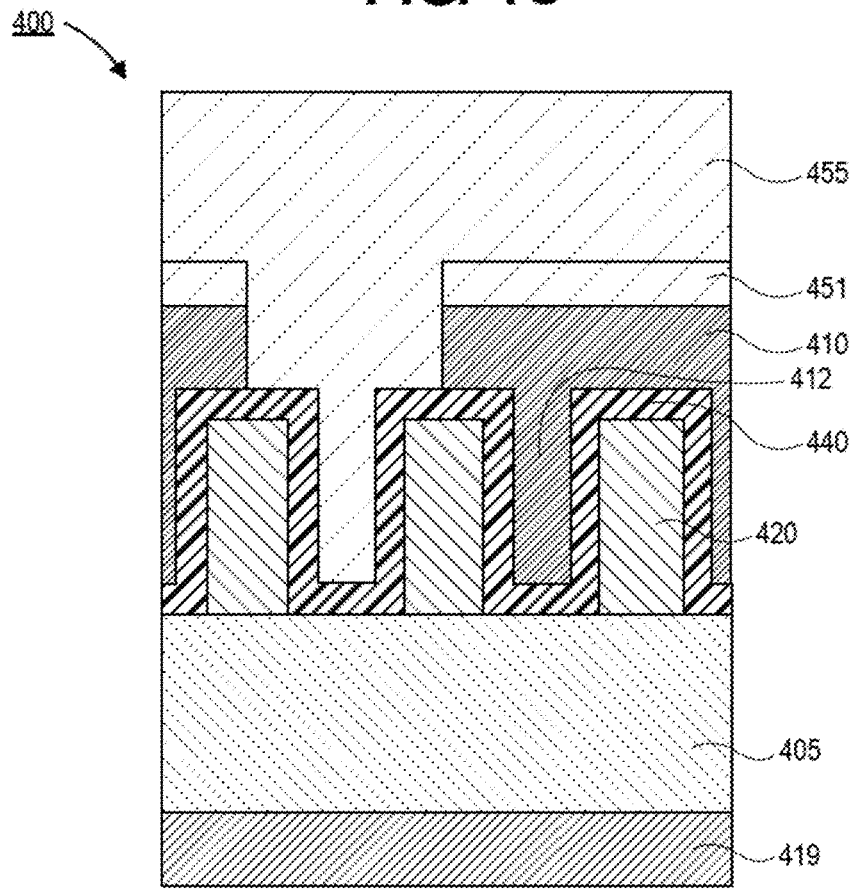
FIG. 4D is a cross-sectional illustration of the semiconductor device after a plug is disposed in the opening, in accordance with an embodiment.

Referring now to FIG. 4D, a cross-sectional illustration after a plug 455 is disposed in the opening 437 and the exposed channel 442 is shown, in accordance with an embodiment. In an embodiment, the plug 455 may be any suitable material that is etch selective to the hardmask 412. For example, the plug 455 may be an oxide.

Figure 4E:
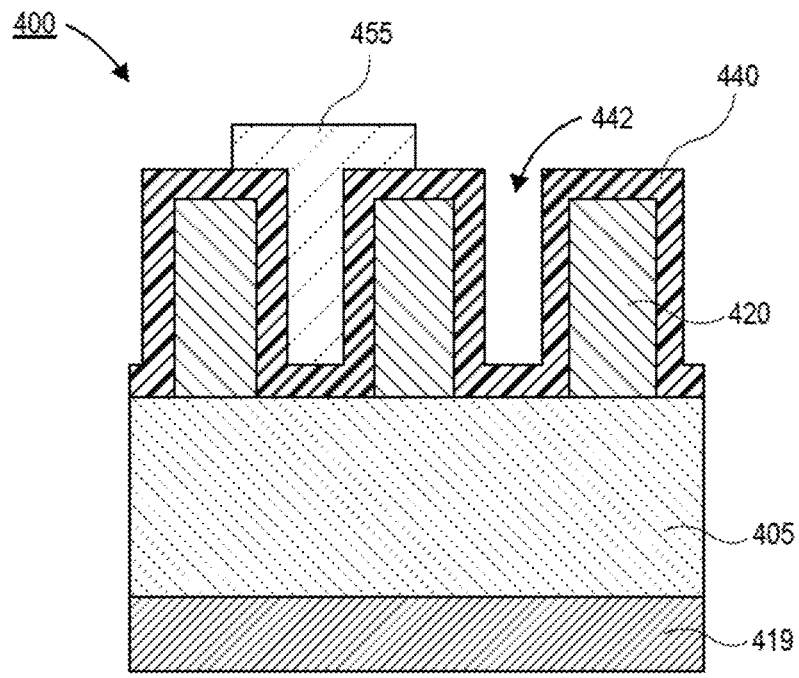
FIG. 4E is a cross-sectional illustration of the semiconductor device after the hardmask is removed, in accordance with an embodiment.

Referring now to FIG. 4E, a cross-sectional illustration after the plug 455 is recessed and the hardmask 410 is removed is shown, in accordance with an embodiment. In an embodiment, the removal of the hardmask opens up the channels 442 that are not protected by the plug 455 and exposes portions of the VEB mask layer 440. In an embodiment, the hardmask 410 may be removed with an ashing process, an etching process, or the like.

Figure 4F:
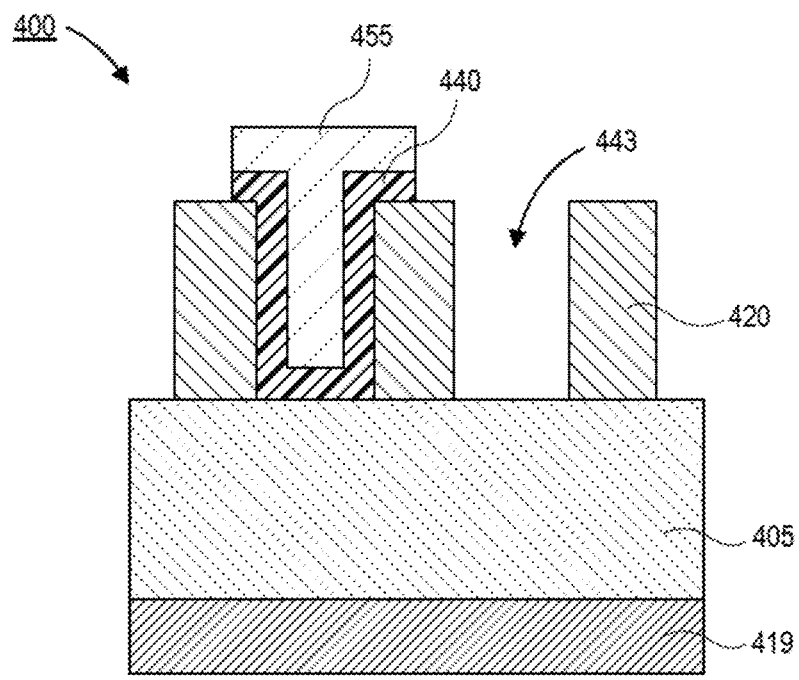
FIG. 4F is a cross-sectional illustration of the semiconductor device after portions of the VEB mask layer are removed to open channels between the grating, in accordance with an embodiment.

Referring now to FIG. 4F, a cross-sectional illustration after the VEB mask layer 440 is selectively etched is shown, in accordance with an embodiment. In an embodiment, the VEB mask layer 440 may be etched with an isotropic etching process. The use of an isotropic etching process allows for the portion of the VEB mask layer 440 in the exposed channel 442 to be cleared to form channels 443 while preserving the portions of the VEB mask layer 440 that are protected by the plug 455. In a particular embodiment, the isotropic etching process is a timed etching process. For example, the etching process may be timed so that after the channels 443 are entirely cleared, the etching process is stopped.

Figure 4G:
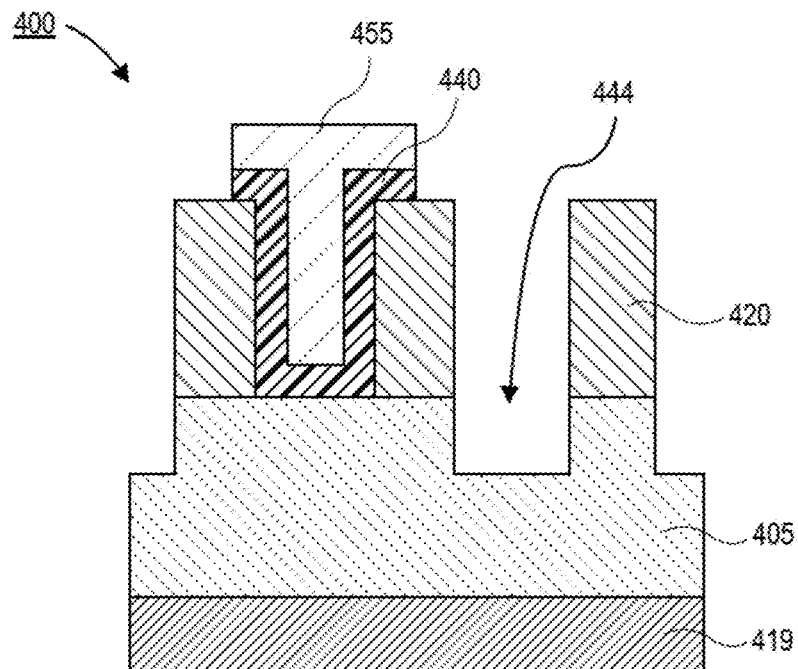
FIG. 4G is a cross-sectional illustration of the semiconductor device after the exposed grating channels are transferred into the substrate, in accordance with an embodiment.

Referring now to FIG. 4G, a cross-sectional illustration after openings 444 are transferred into the ILD 405 is shown, in accordance with an embodiment. In an embodiment, the openings 444 may be patterned using the channel 443 as a masking layer. Accordingly, regions of the ILD 405 below the plug 455 are preserved.

Figure 5A:
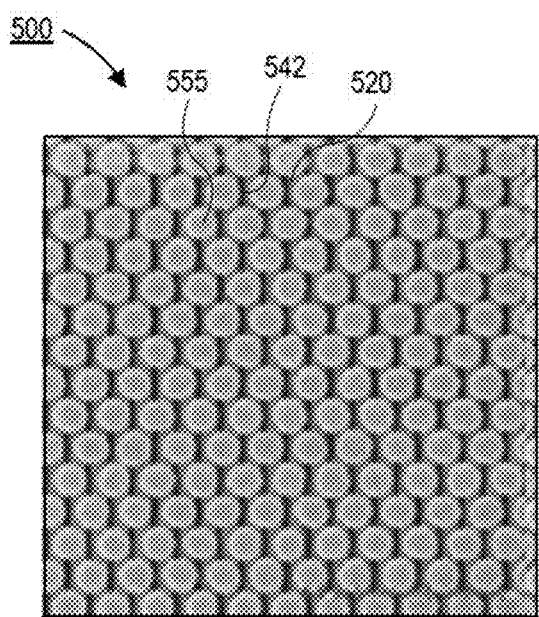
FIG. 5A is a plan view micrograph of a semiconductor device that illustrates the plugs in the channels, in accordance with an embodiment.
Figure 5B:
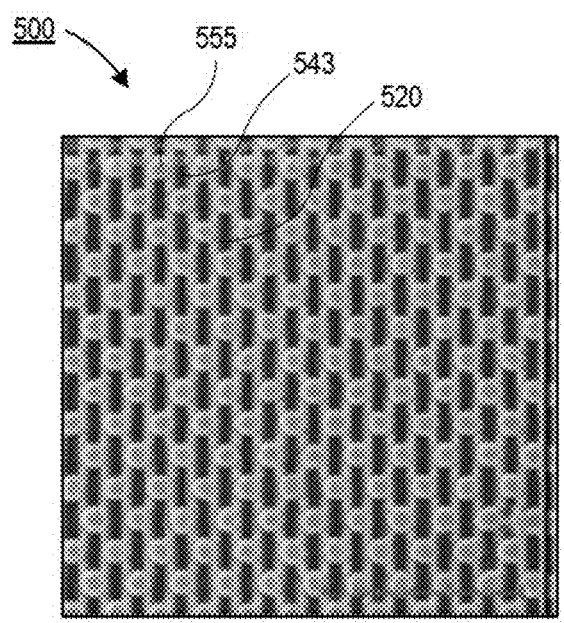
FIG. 5B is a plan view micrograph of the semiconductor device after VEB mask layer is selectively removed and the plugs are shrunk, in accordance with an embodiment.

Referring now to FIGS. 5A and 5B, a series of plan view micrographs that depict the formation of the plug 555 in a semiconductor device 500 is shown, in accordance with an embodiment. As shown in FIG. 5A, the plugs 555 extend over portions of the lines of the grating 520. Further, FIG. 5A illustrates the channels 542 as being narrow slits. This is because the VEB mask layer is still present and reduces the width of the opening between the lines of the grating 520. In FIG. 5B, the VEB mask layer has been removed and openings 543 are shown. The openings 543 are wider than openings 542 in FIG. 5A since the VEB mask layer has been removed. Additionally, the plugs 555 may also be shrunk. That is, the plugs 555 may be reduced in dimension since there is no protection along sidewall surfaces that are not directly contacted by the VEB mask layer.

Referring now to FIGS. 6A-6D, a series of cross-sectional illustrations depict a process for forming a semiconductor device 600 that includes a VEB mask layer is shown, in accordance with an embodiment.

Figure 6A:
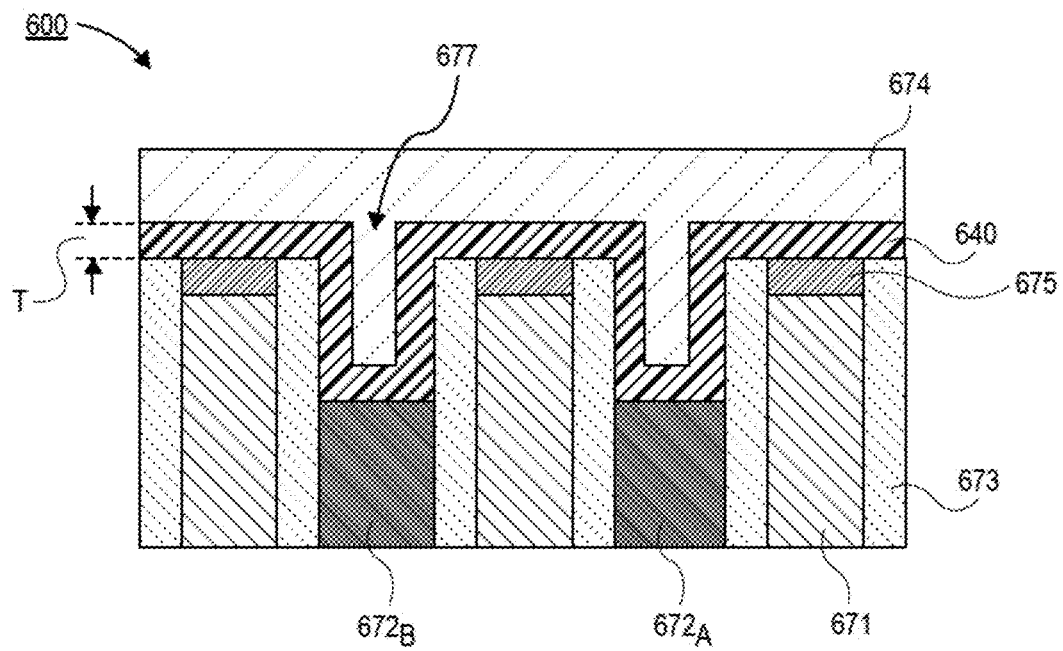
FIG. 6A is a cross-sectional illustration of a semiconductor device with gate contacts, source/drain (S/D) contacts and a VEB mask layer, in accordance with an embodiment.

Referring now to FIG. 6A, a cross-sectional illustration of a semiconductor device 600 with a plurality of gate contacts 672 and a plurality of source/drain (S/D) contacts 671 is shown, in accordance with an embodiment. In an embodiment, the gate contacts 672 and the S/D contacts 671 may be embedded in a first ILD 673. The gate contacts 672 may be in an alternating pattern with the S/D contacts 671. For example, an S/D contact 671 may be positioned between a first gate contact $672_A$ and a second gate contact $672_B$. In an embodiment, top surfaces of the gate contacts 672 may be recessed so that they are below top surfaces of the S/D contacts 671. Accordingly, channels 677 in the first ILD 673 are located above the gate contacts 672. In an embodiment, the top surfaces of the S/D contacts 671 may be covered by a mask layer 675.

In an embodiment, a VEB mask layer 640 may be positioned over the S/D contacts 671, the gate contacts 672, and the first ILD 673. The VEB mask layer 640 is a conformal layer. As such, the VEB mask layer 640 extends along sidewall surfaces of the channels 677. The remaining volume of the channels 677 may be filled with a second ILD 674. In an embodiment, a portion of the VEB mask layer 640 may be between the second ILD 674 and the S/D contact 671. In an embodiment, the VEB mask layer 640 may be substantially similar to the VEB mask layers described above, with the exception that the VEB mask layer 640 is an insulative material. Accordingly, the VEB mask layer 640 may have a thickness T that is 10 nm or less or 5 nm or less, and the VEB mask layer 640 may comprise silicon and nitrogen (e.g., SiN), silicon and oxygen (e.g., $SiO_2$), or aluminum and oxygen (e.g., $Al_2O$).

Figure 6B:
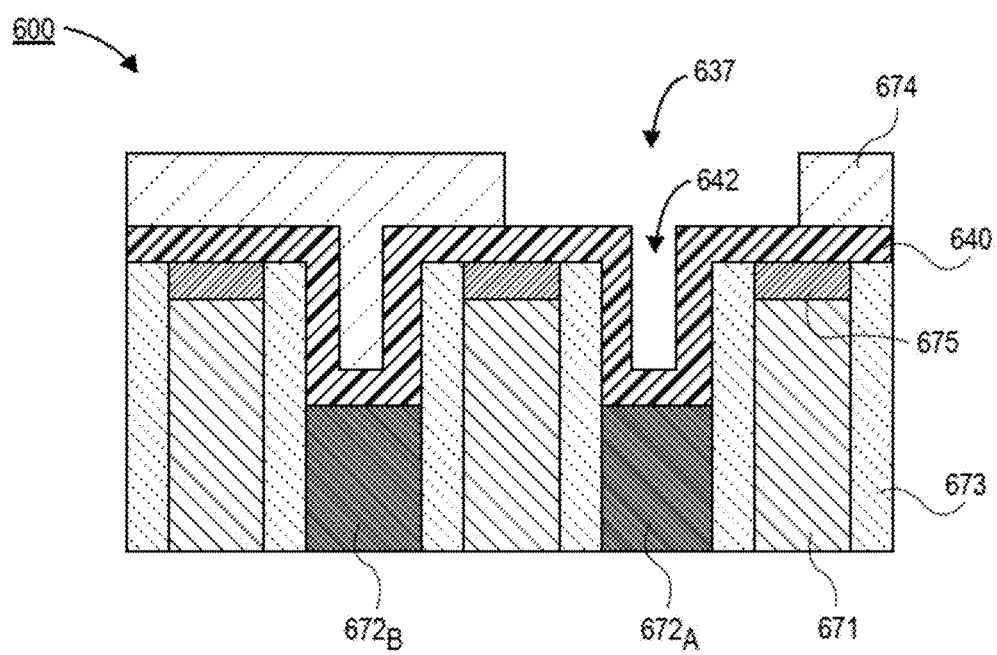
FIG. 6B is a cross-sectional illustration of a semiconductor device after a portion of the VEB mask layer is exposed, in accordance with an embodiment.

Referring now to FIG. 6B, a cross-sectional illustration after an opening 637 is formed into the second ILD 674 is shown, in accordance with an embodiment. In an embodiment, the opening 637 may be positioned above the gate contact $672_A$. The opening 637 may result in a channel 642 being cleared so that sidewalls of the VEB mask layer 640 are exposed.

Figure 6C:
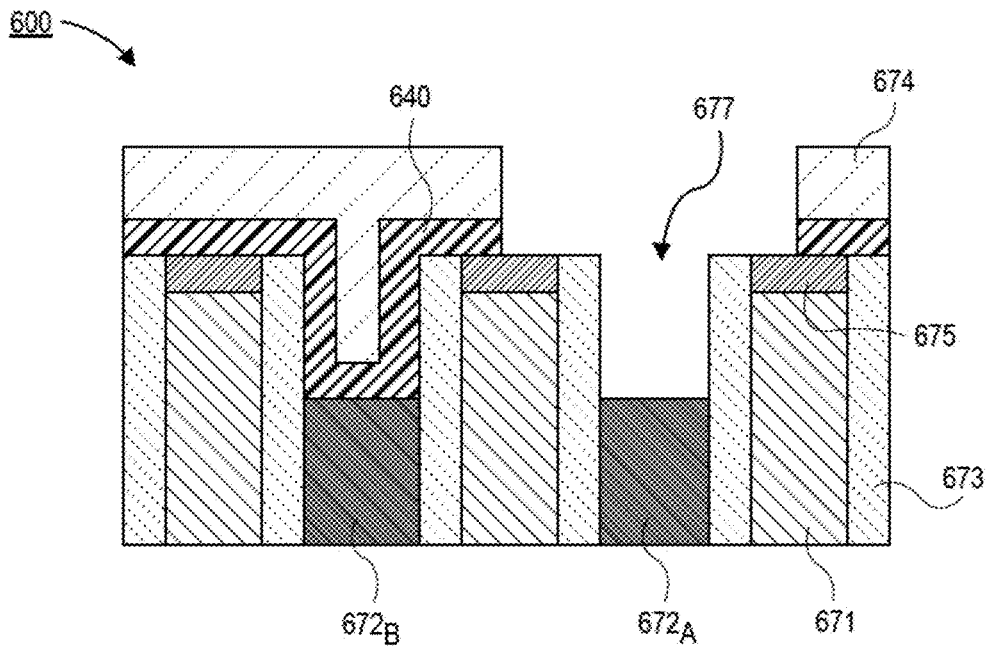
FIG. 6C is a cross-sectional illustration of a semiconductor device after the exposed portion of the VEB mask layer is removed, in accordance with an embodiment.

Referring now to FIG. 6C, a cross-sectional illustration after the VEB mask layer 640 in the opening 637 is removed is shown, in accordance with an embodiment. In an embodiment, the VEB mask layer 640 may be removed with an isotropic etching process. Removal of the VEB mask layer 640 results in the channel 677 being cleared above the gate electrode $672_A$. In an embodiment, a width of the channel 677 is smaller than a width of the opening 637 that passes through the second ILD 674.

Figure 6D:
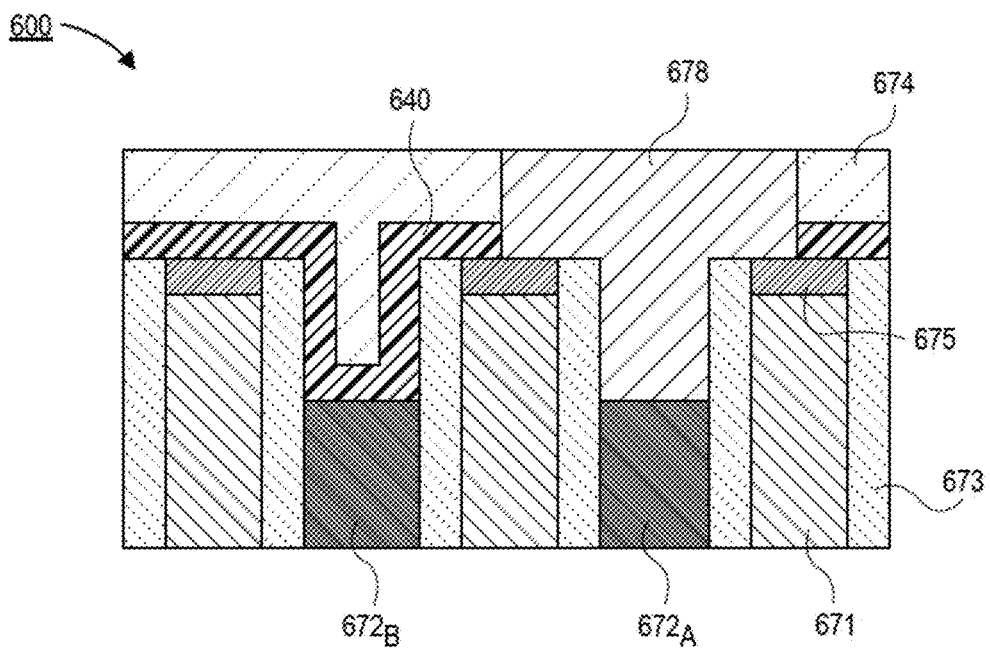
FIG. 6D is a cross-sectional illustration of a semiconductor device after the fill metal is disposed in the opening, in accordance with an embodiment.

Referring now to FIG. 6D, a cross-sectional illustration after a fill metal 678 is disposed in the channel 677 is shown, in accordance with an embodiment. In an embodiment, the fill metal 678 may be in direct contact with the gate contact $672_A$. Furthermore, the fill metal 678 may also be in contact with portions of the VEB mask layer 640. In an embodiment, the fill metal 678 may have a first width in the channel 677 and a second width that is greater than the first width through the second ILD 674. In some embodiments, a portion of the fill metal 678 may be directly above the S/D contacts 671 that are adjacent to the gate contact $672_A$.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
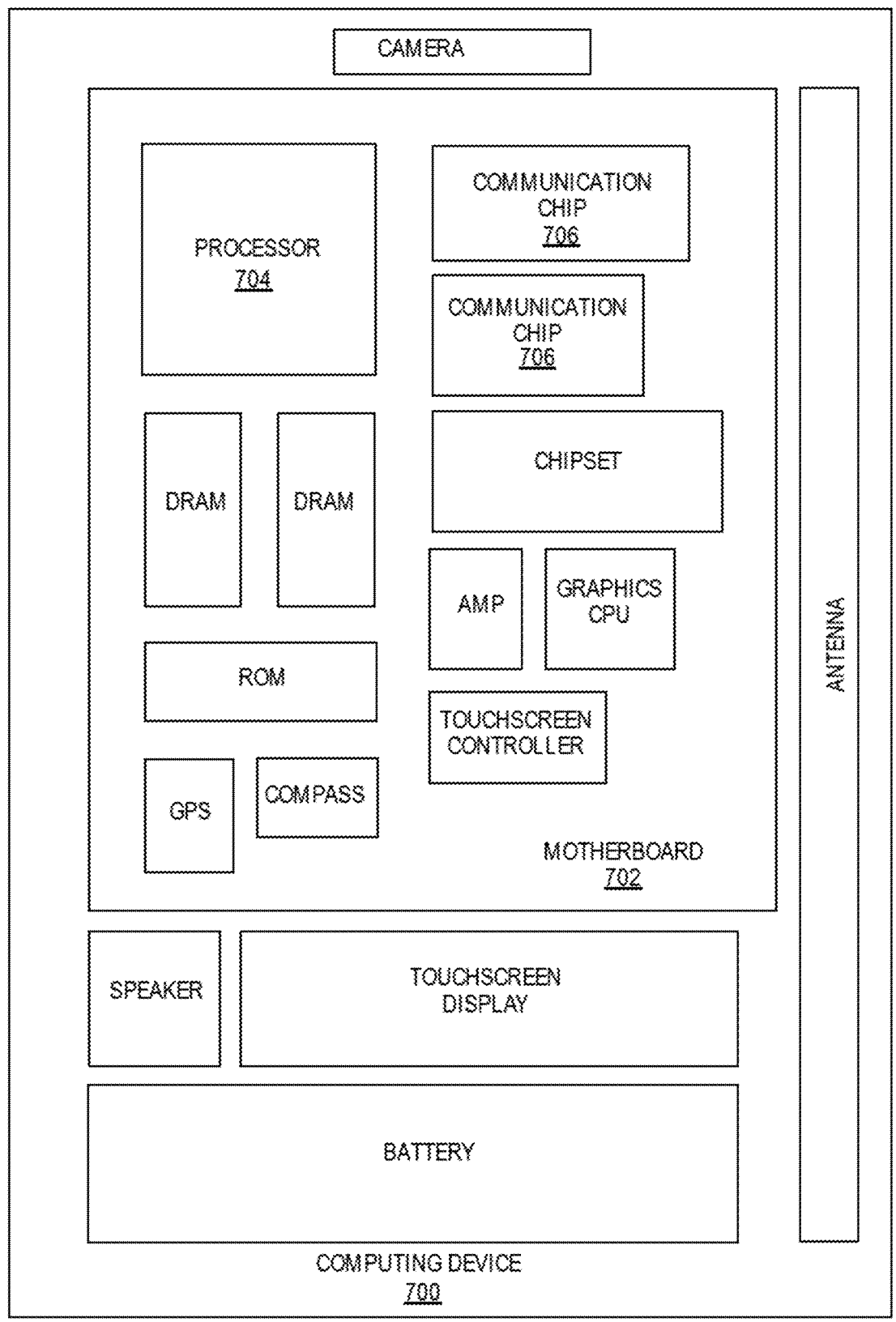
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor may comprise a BEOL stack that comprises one or more plugs and/or vias that are manufactured using a VEB mask layer, as described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip m may comprise a BEOL stack that comprises one or more plugs and/or vias that are manufactured using a VEB mask layer, as described herein.

In further implementations, another component housed within the computing device 700 may comprise a BEOL stack that comprises one or more plugs and/or vias that are manufactured using a VEB mask layer, as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
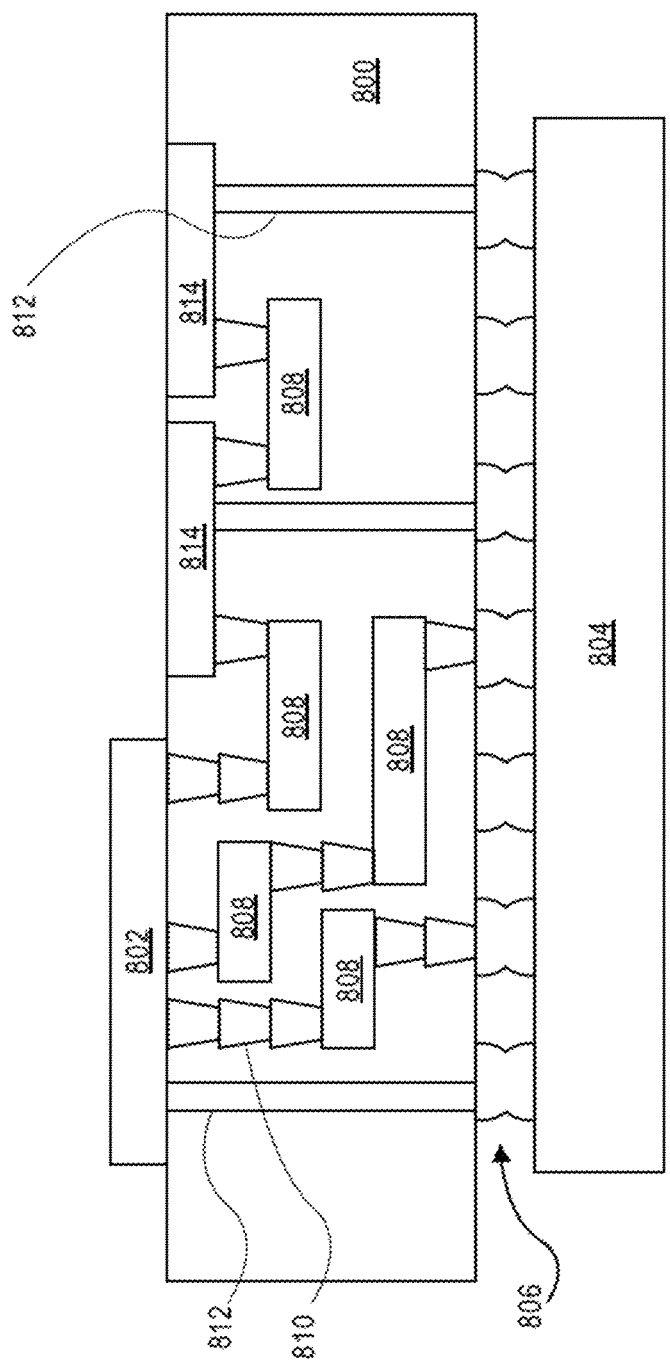
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. In an embodiment, one of both of the first substrate 802 and the second substrate 804 may comprise a BEOL stack that comprises one or more plugs and/or vias that are manufactured using a VEB mask layer, in accordance with embodiments described herein. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure may comprise a BEOL stack that comprises one or more plugs, vias, and/or cuts that are manufactured using an edge placement error mitigation scheme, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a first interlayer dielectric (ILD); a plurality of source/drain (S/D) contacts in the first ILD; a plurality of gate contacts in the first ILD, wherein the gate contacts and the S/D contacts are arranged in an alternating pattern, and wherein top surfaces of the gate contacts are below top surfaces of the S/D contacts so that a channel defined by sidewall surfaces of the first ILD is positioned over each of the gate contacts; mask layer partially filling a first channel over a first gate contact; and a fill metal filling a second channel over a second gate contact that is adjacent to the first gate contact.

Example 2: the semiconductor device of Example 1, further comprising: a second ILD, wherein the second ILD fills a remainder of the first channel not filled by the mask layer.

Example 3: the semiconductor device of Example 2, wherein the fill metal passes through the second ILD, and wherein a width of the fill metal in the second ILD is greater than a width of the second channel.

Example 4: the semiconductor device of Example 2, wherein the mask layer is between the second ILD and one or more of the S/D contacts.

Example 5: the semiconductor device of Example 4, wherein the fill metal directly contacts the mask layer.

Example 6: the semiconductor device of Examples 1-5, wherein the mask layer is a conformal layer that lines sidewall surfaces and a bottom surface of the first channel.

Example 7: the semiconductor device of Examples 1-6, wherein a thickness of the mask layer is approximately 5 nm or less.

Example 8: the semiconductor device of Examples 1-7, wherein the mask layer comprises silicon and nitrogen, silicon and oxygen, or aluminum and oxygen.

Example 9: a method of fabricating an interconnect layer over a semiconductor die, comprising: fabricating a grating comprising a plurality of parallel lines over a substrate, wherein the parallel lines define a plurality of channels; depositing a mask layer over the grating; depositing a hardmask over the mask layer, wherein the hardmask fills the plurality of channels; patterning the hardmask to form an opening that spans between neighboring lines, wherein the hardmask is cleared from the channel exposed under the opening; recessing the hardmask, wherein a top surface of the hardmask is below a top surface of the mask layer; and etching the mask layer with an isotropic etching process, wherein the etching process removes the mask layer from the exposed channel.

Example 10: the method of Example 9, further comprising: etching the substrate to form an opening in the substrate.

Example 11: the method of Example 10, wherein the opening exposes an underlying trace.

Example 12: the method of Examples 9-11, wherein etching the mask layer removes the mask layer from top surfaces of the grating.

Example 13: the method of Examples 9-12, wherein remaining portions of the hardmask covers vertical surfaces of the mask layer and prevents significant removal of the hardmask during the isotropic etching process.

Example 14: the method of Examples 9-13, wherein the isotropic etching process is a timed etch.

Example 15: the method of Examples 9-14, wherein the mask layer has a thickness that is approximately 5 nm or less.

Example 16: the method of Examples 9-15, wherein the parallel lines of the grating have a pitch of approximately 30 nm or less, and wherein the parallel lines of the grating have a width of approximately 12 nm or less.

Example 17: the method of Examples 9-16, wherein the mask layer is etch selective to the grating.

Example 18: the method of Example 17, wherein the mask layer comprises silicon and nitrogen, silicon and oxygen, aluminum and oxygen, or titanium and nitrogen.

Example 19: a method of fabricating an interconnect layer over a semiconductor die, comprising: fabricating a grating comprising a plurality of parallel lines over a substrate, wherein the parallel lines define a plurality of channels; depositing a mask layer over the grating; depositing a hardmask over the mask layer, wherein the hardmask fills the plurality of channels; patterning the hardmask to form an opening that spans between neighboring lines, wherein the hardmask is cleared from the channel exposed under the opening; filling the opening with a plug; removing the hardmask; etching the mask layer with an isotropic etching process, wherein the mask layer is removed in locations where the mask layer is not covered by the plug; and transferring the pattern of the exposed portions of the plurality of channels into the substrate.

Example 20: the method of Example 19, wherein the mask layer has a thickness of approximately 5 nm or less.

Example 21: the method of Example 19 or Example 20, wherein the mask layer comprises silicon and nitrogen, silicon and oxygen, aluminum and oxygen, or titanium and nitrogen.

Example 22: the method of Examples 19-21, wherein a width of the plug along the direction of the channels is reduced during the removal of the mask layer.

Example 23: an electronic system, comprising: a motherboard; and a die electrically coupled to the motherboard, wherein the die comprises: a first interlayer dielectric (ILD); a first gate contact in the first ILD; a second gate contact in the first ILD and adjacent to the first gate contact; a mask layer over and in contact with the first ILD and a top surface of the first gate contact, wherein the mask layer is conformal and lines a first channel into the first ILD over the first gate contact; and a fill metal filling a second channel over the second gate contact, wherein the fill metal is in direct contact with a top surface of the second gate contact.

Example 24: the electronic system of Example 23, wherein a remaining portion of the first channel that is not filled by the mask layer is filled by a second ILD.

Example 25: the electronic system of Example 23 or Example 24, wherein a thickness of the mask layer is approximately 5 nm or less.

What is claimed is:
1. A method of fabricating an interconnect layer over a semiconductor die, comprising:

fabricating a grating comprising a plurality of parallel lines over an interlayer dielectric (ILD), wherein the plurality of parallel lines defines a plurality of channels;

depositing a mask layer over the grating;

depositing a hardmask over the mask layer, wherein the hardmask fills the plurality of channels;

patterning the hardmask to form an opening that spans between neighboring lines of the plurality of parallel lines, wherein the hardmask is cleared from a channel of the plurality of channels that is exposed under the opening;

recessing the hardmask, wherein a top surface of the hardmask is below a top surface of the mask layer; and etching the mask layer with an isotropic etching process, wherein the isotropic etching process removes the mask layer from the exposed channel.

2. The method of claim 1, further comprising:

etching the ILD to form an opening in the ILD.

3. The method of claim 2, wherein the opening exposes an underlying trace.

4. The method of claim 1, wherein etching the mask layer removes the mask layer from top surfaces of the grating.

5. The method of claim 1, wherein remaining portions of the hardmask covers vertical surfaces of the mask layer and prevents removal of the hardmask during the isotropic etching process.

6. The method of claim 1, wherein the isotropic etching process is a timed etch.

7. Method of claim 1, wherein the mask layer is deposited with a thickness that is approximately 5 nm or less.

8. The method of claim 1, wherein the plurality of parallel lines of the grating has a pitch of approximately 30 nm or less, and wherein the plurality of parallel lines of the grating has a width of approximately 12 nm or less.

9. The method of claim 1, wherein the mask layer is etch selective to the grating.

10. The method of claim 9, wherein the mask layer comprises silicon and nitrogen, silicon and oxygen, aluminum and oxygen, or titanium and nitrogen.

11. A method of fabricating an interconnect layer over a semiconductor die, comprising:

fabricating a grating comprising a plurality of parallel lines over an interlayer dielectric (ILD), wherein the plurality of parallel lines defines a plurality of channels;

depositing a mask layer over the grating;

depositing a hardmask over the mask layer, wherein the hardmask fills the plurality of channels;

patterning the hardmask to form an opening that spans between neighboring lines of the plurality of parallel lines, wherein the hardmask is cleared from a channel of the plurality of channels that is exposed under the opening;

filling the opening with a plug;

removing the hardmask;

etching the mask layer with an isotropic etching process, wherein the mask layer is removed to form a pattern of exposed portions of the plurality of channels in locations where the mask layer is not covered by the plug; and transferring the pattern of the exposed portions of the plurality of channels into the ILD.

12. The method of claim 11, wherein the mask layer is deposited with a thickness of approximately 5 nm or less.

13. The method of claim 11, wherein the mask layer comprises silicon and nitrogen, silicon and oxygen, aluminum and oxygen, or titanium and nitrogen.

14. The method of claim 11, wherein a width of the plug along a direction of the plurality of channels is reduced during the removal of the mask layer.

15. A method of fabricating a semiconductor device, the method comprising:

forming a first interlayer dielectric (ILD);

forming a plurality of source/drain (S/D) contacts in the first ILD;

forming a first mask layer on the plurality of S/D contacts;

forming a plurality of gate electrodes in the first ILD, wherein the plurality of gate electrodes and the plurality of S/D contacts are arranged in an alternating pattern, and wherein top surfaces of the plurality of gate electrodes are below top surfaces of the plurality of S/D contacts so that a plurality of channels defined by sidewall surfaces of the first ILD is positioned over each of the plurality of gate electrodes;

forming a second mask layer partially filling a first channel of the plurality of channels over a first gate electrode of the plurality of gate electrodes, wherein the first mask layer is vertically between a S/D contact of the plurality of S/D contacts and the second mask layer; and forming a fill metal filling a second channel of the plurality of channels over a second gate electrode of the plurality of gate electrodes that is adjacent to the first gate electrode.

16. The method of claim 15, further comprising:

forming a second ILD, wherein the second ILD fills a remainder of the first channel not filled by the second mask layer.

17. The method of claim 16, wherein the fill metal passes through the second ILD, and wherein a width of the fill metal in the second ILD is greater than a width of the second channel.

18. The method of claim 16, wherein the second mask layer is between the second ILD and one or more of the S/D contacts.

19. The method of claim 18, wherein the fill metal directly contacts the second mask layer.

20. The method of claim 16, wherein the second mask layer is a conformal layer that lines sidewall surfaces and a bottom surface of the first channel.

21. The method of claim 16, wherein a thickness of the second mask layer is approximately 5 nm or less.

22. The method of claim 16, wherein the second mask layer comprises silicon and nitrogen, silicon and oxygen, or aluminum and oxygen.

* * * * *